United States Patent [19]

Rinderle

[11] Patent Number: 4,983,928
[45] Date of Patent: Jan. 8, 1991

[54] CONTROLLABLE AMPLIFIER CIRCUIT

[75] Inventor: Heinz Rinderle, Heilbronn, Fed. Rep. of Germany

[73] Assignee: Telefunken Electronic GmbH, Fed. Rep. of Germany

[21] Appl. No.: 326,047

[22] Filed: Mar. 20, 1989

[30] Foreign Application Priority Data

Apr. 11, 1988 [DE] Fed. Rep. of Germany ....... 3811947

[51] Int. Cl.$^5$ ............................................. H03G 3/30
[52] U.S. Cl. ...................................... 330/254; 330/307
[58] Field of Search ..................... 330/254, 285, 307

[56] References Cited

U.S. PATENT DOCUMENTS

| | | | |
|---|---|---|---|
| 3,502,997 | 3/1970 | Narud et al. | 330/285 |
| 3,531,732 | 9/1970 | Thompson | 330/285 X |
| 3,533,005 | 10/1970 | Alm | 330/285 |
| 3,803,505 | 4/1974 | Ishigaki et al. | 330/254 |
| 4,013,972 | 3/1977 | Nishitoba et al. | 330/254 |
| 4,017,804 | 4/1977 | Hunsinger | 330/254 |
| 4,318,051 | 3/1982 | Harwood et al. | 330/254 |
| 4,327,333 | 4/1982 | Wilcox | 330/254 X |

Primary Examiner—James B. Mullins
Attorney, Agent, or Firm—Spencer & Frank

[57] ABSTRACT

In a controllable amplifier circuit with an amplifier transistor a further transistor is provided that, when actuated under control conditions, deprives the amplifier transistor of at least a part of the input signal.

28 Claims, 7 Drawing Sheets

4,983,928

CONTROLLABLE AMPLIFIER CIRCUIT

BACKGROUND OF THE INVENTION

The present invention relates to a controllable amplifier circuit having an amplifier transistor, for use as an HF preselector stage for radio receivers.

SUMMARY OF THE INVENTION

The object underlying the invention is to indicate a controllable amplifier circuit which is particularly advantageous for use as an HF preselector stage for radio receivers and in monolithic technology. According to the invention, there is provided a controllable amplifier circuit, wherein besides an amplifier transistor a further transistor is provided that, when actuated under control conditions, deprives the amplifier transistor of at least a part of the input signal.

BRIEF DESCRIPTION OF THE DRAWINGS

The invention will now be described in greater detail, by way of examples, with reference to the drawings, in which.

DETAILED DESCRIPTION OF THE PREFERRED EMBODIMENT

Figure 1:
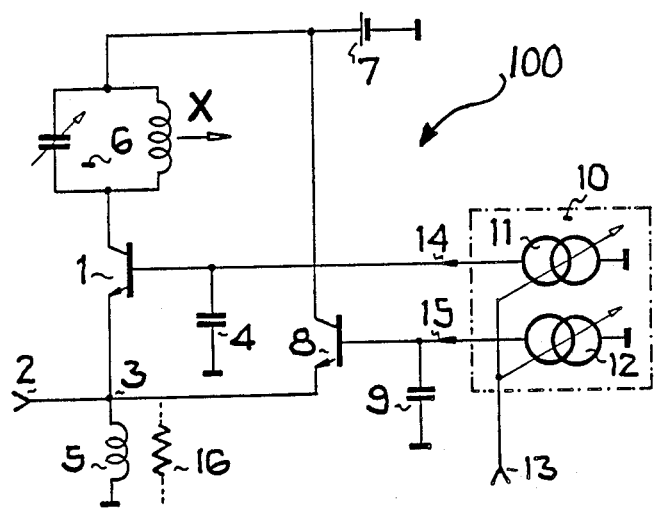
FIG. 1 shows a controllable amplifier circuit.

FIG. 1 shows a controllable amplifier circuit 100 in accordance with the invention. The amplifier stage in accordance with FIG. 1, for example, is a selective high-frequency amplifier whose amplification is controllable. The amplifier transistor 1 operates, in the circuit according to FIG. 1, for the signal to be amplified in the main base circuit where an input signal 2 is supplied to the emitter of amplifier transistor 1. The base of transistor 1 is connected via capacitor 4 to the reference potential or ground. Between an input connection 3 and the ground is a coil 5 which separates the input signal from the reference potential as regards the AC current. The collector output signal of transistor 1 passes to a selection circuit 6 that selects out a certain signal. The selected signal is separated out of the selection circuit 6 (indicated by arrow X) and passed to a mixer stage (not shown), for example. Voltage source 7 serves as the operating voltage source.

Input connection 3 of the circuit 100 is not only connected to the emitter of transistor 1, but also to the emitter of a further transistor 8. The base of transistor 8 is connected to reference potential via a capacitor 9. The bases of transistors 1 and 8 are driven as regards DC current by controllable current sources 11 and 12 of a control circuit 10. In the embodiment according to FIG. 1, the control circuit 10 comprises the two controllable current sources 11 and 12. Current sources 11 and 12 are driven by a control signal 13. With the aid of control signal 13, the base currents 14 and 15 of transistors 1 and 8 are controlled. Control of the base currents 14 and 15 has the effect of controlling the amplification of the circuit 100.

In the uncontrolled condition (amplification maximum), only the base of transistor 1 receives a base current (14), while the base of transistor 8 is not supplied with a base current. In this case, the input signal 2 passes to the selection circuit 6 exclusively via the emitter-collector path of transistor 1. To reduce the amplification, the base of transistor 8 also receives a base circuit. If transistor 8 receives base current, it is set to be conductive. The result of this is that part of the signal current from the input signal 2 is diverted via the emitter-collector path of transistor 8 to voltage source 7. This in turn has the result that the signal current from the input signal 2 is split up, namely into one part that is passed to the selection circuit 6 and into another part passed to the voltage source 7. The result is a reduction in the signal current from the input signal 2 passing to the selection circuit 6. A reduction of the signal current 6 reaching the selection circuit is equivalent to a reduction in the amplification of the amplifier stage.

It is recommended to control the base currents 14 and 15 for transistors 1 and 8 in opposite directions and to keep the sum (size) of base currents 14 and 15 constant. In this type of base current control the load from voltage source 7 remains independent of the respective control condition. The coil 5 can be designed advantageously so that it acts as part of the input selection network.

In the circuit in FIG. 1 it is possible to provide, instead of coil 5, a resistor 16 for AC current separation of the signal from the reference potential. In this case the control of base currents 14 and 15 with constant sum is advantageous, since this keeps the potential of the input terminal 3 constant during amplification control. A further advantage of maintaining the sum of base currents 14 and 15 constant is that the input admittance of the amplifier circuit 100 remains constant during control.

Figure 2:
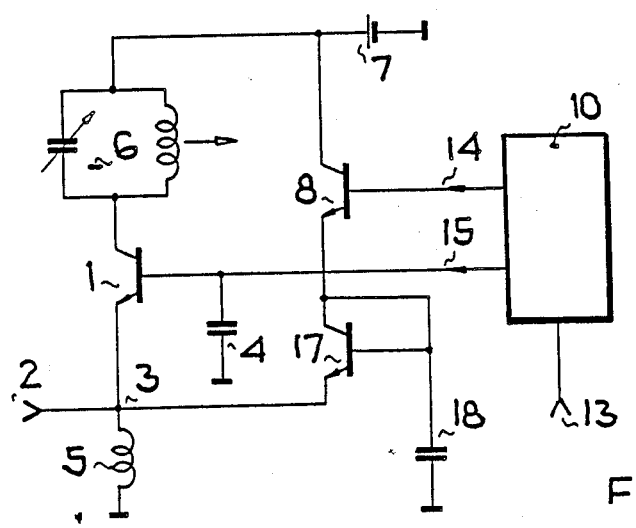
FIG. 2 shows an amplifier circuit with a third transistor.

The array in FIG. 2 differs from that in FIG. 1 in that a third transistor 17 is provided, which is switched as a diode. The emitter-collector path of transistor 17 is between the input 3 and the emitter of the further transistor 8. The base and the collector of the third transistor 17 are connected to the reference potential via capacitor 18.

The circuit in FIG. 2 differs from that in FIG. 1 in that the input signal in the FIG. 2 circuit is not diverted to voltage source 7, but via the capacitor 18 to the reference potential. The fact that the signal current from the input signal 2 is kept away from the operating voltage source 7 avoids disturbances on the supply line to voltage source 7. Disturbances along this path can result when strong signals occur and these affect other circuit components which are also integrated (e.g., an oscillator).

Figure 3:
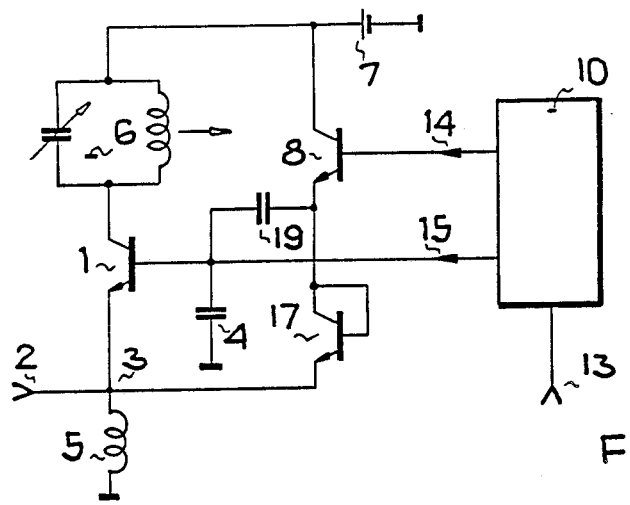
FIG. 3 shows an amplifier circuit with a capacitor between the base of the first transistor and the common base-collector connection of the third transistor.

The FIG. 3 circuit differs from that in FIG. 2 in that capacitor 18 in FIG. 2 is not used in the circuit of FIG. 3, and that a capacitor 19 is connected instead between the joint base-collector connection of the third transistor 17 and the base of transistor 1.

The circuit in FIG. 3 including a capacitor 19 between the base of transistor 1 and the joint base-collector connection of the third transistor 17, there exists the advantage that a smaller potential difference is applied to capacitor 19. If capacitor 19 is designed as a barrier layer capacitor in an integrated circuit, it is possible to reduce the size of the chip areas for capacitor 19 in such an integrated circuit by making the barrier layer zones of capacitor 19 from highly doped layers, for example.

Figure 4:
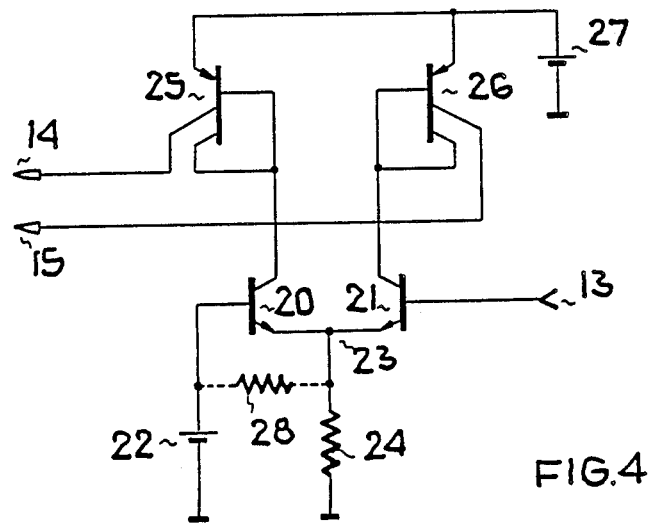
FIG. 4 shows a control circuit.

FIG. 4 shows an embodiment for of the control circuit 10. The control circuit 10 in FIG. 4 has a differential circuit with transistors 20 and 21. Between the base of transistor 20 and the reference point is a voltage source 22. The voltage of voltage source 22 is selected preferably so that the collector current of the driven amplifier transistor 1 remains largely dependent on the temperature. The emitters of the two transistors 20 and 21 are connected to one another, and a resistor 24, designed in accordance with the invention as a pinch resistor, is connected between connection point 23 of the two emitters and the reference point. If a resistor 28, which is also a pinch resistor, is used, it is possible to achieve other voltage values for source 22 with the same temperature independence.

Control signal 13 controls the base of differential transistor 21 in the FIG. 4 circuit. With the aid of control signal 13, the distribution of the emitter currents of the two differential transistors 20 and 21 is controlled, and so the collector currents of transistors 20 and 21 are also controlled by the control signal 13. The collector currents of transistors 20 and 21 control current-inverting transistors 25 and 26 respectively, whose inverted output currents 14 and 15 supply the base currents for the transistors 1 and 8 to be controlled in FIGS. 1, 2 and 3. A pinch resistor 24 connects a connection point 23 of transistors 20 and 21 with the reference potential. A resistor 28 can be connected between the connection point 23 and the voltage source 22. A voltage source 27 is provided between the emitters of the current-inverting transistors 25 and 26 and the reference potential.

Figure 5:
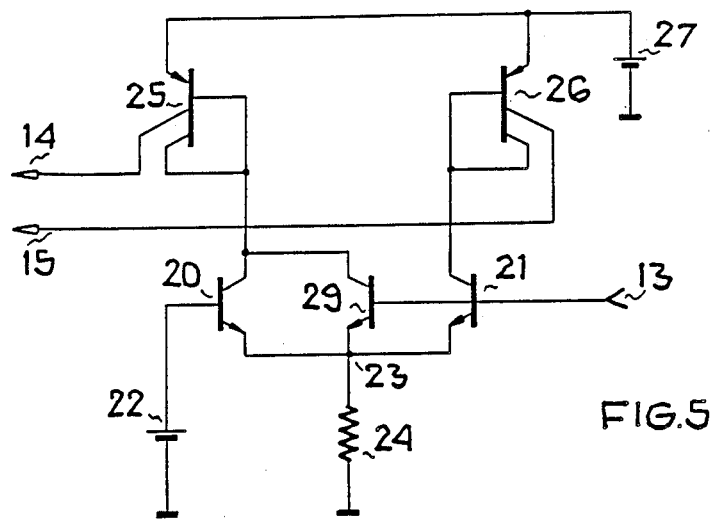
FIG. 5 shows the control circuit in FIG. 4 with an additional transistor.

The FIG. 5 circuit differs from that in FIG. 4 in that a further additional transistor 29 is provided in the differential circuit, and has an emitter which is connected to the connection point 23 and a collector connected to the collector of transistor 20. The additional transistor 29 prevents the current distribution between the output currents of transistors 20 and 21 becoming random. This means that the amplification reduction of the circuits in FIGS. 1 to 3 caused by control remains limited. The degree of amplification reduction depends on the ratio of the emitter surfaces of transistors 21 and 29.

Figure 6:
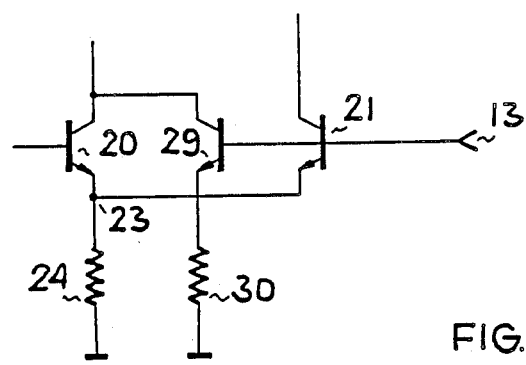
FIG. 6 shows a differential circuit.
Figure 7:
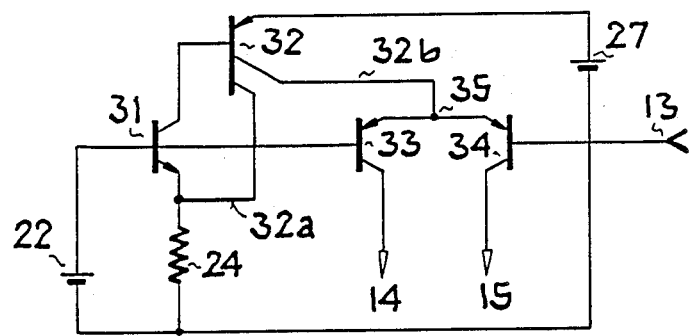
FIG. 7 shows another embodiment of a control circuit.

FIG. 6 shows a differential circuit in which the emitter of transistor 29 is not connected to connection point 23 of the emitters of transistors 20 and 21, as shown in FIG. 6, but in which the emitter of transistor 29 is connected, in the differential circuit in FIG. 7, to the reference potential via a resistor 30. In the circuit according to FIG. 6 the collector current of transistor 29 is set with the aid of resistor 30. In accordance with the invention, resistor 30 is a pinch resistor made together with, and in the same operation as the base zone of the transistors.

FIG. 7 shows a further embodiment of control circuit 10. The control circuit in FIG. 7 has a current-inverting circuit comprising transistor 31 and multiple-collector transistor 32. The collector of transistor 31 is connected to the base of transistor 32. The emitter of transistor 32 is connected to voltage source 27. The emitter of transistor 31 is connected to collector 32a of transistor 32 and, via pinch resistor 24, to the reference potential. The base of transistor 31 is connected to voltage source 22.

In the control circuit in FIG. 7, a differential circuit is also provided that comprises transistors 33 and 34. The collector currents 14 and 15 respectively of transistors 33 and 34 pass to the amplifier circuit (transistors 1 and 8). Control signal 13 passes to the base of transistor 34. The base of transistor 33 is connected to voltage source 22. Collector 32b of transistor 32 is connected to a connection point 35 of the emitters of the two transistors 33 and 34.

The current-inverting circuit (31, 32) supplies a current passing to the emitters of transistors 33 and 34 via connection point 35. Control signal 13 determines the current distribution of the currents passing to outputs 14 and 15 of the control circuit.

The control circuit in FIG. 7 has the advantage that output currents 14 and 15 are relatively independent of changes in the operating voltage source 27.

Figure 8:
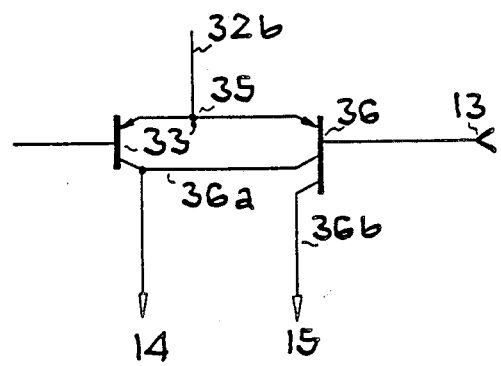
FIG. 8 shows another embodiment of a differential circuit.

FIG. 8 shows a differential circuit which can be used instead of the differential circuit in FIG. 7. The FIG. 8 differential circuit comprises a transistor 33' and a multi-collector transistor 36 whose one collector 36b is connected to output 15. The use of a multiple-collector transistor (36) instead of a normal transistor (34) has the advantage that the current ratio of the two currents 14 and 15 can be limited.

As already stated, during fabrication of an integrated circuit according to the invention all pinch resistors of the circuits shown are made simultaneously and in the same operation as the base zones of the (npn) transistors integrated.

Figure 9:
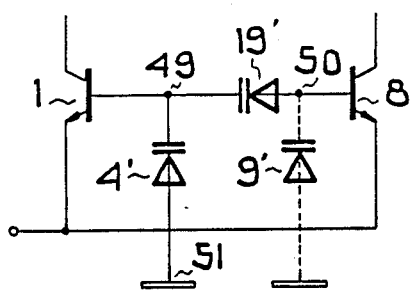
FIG. 9 shows the integration of capacitors.

FIG. 9 shows a possible embodiment which can be used for integration of the blocking capacitors (4, 9) of transistors 1 and 8 and of capacitor 19', corresponding to capacitor 19 in FIG. 3. In this embodiment, blocking capacitors 4 and 9 in FIG. 9 are achieved with barrier layer capacitors 4' and 9'. In the array in FIG. 9, barrier layer capacitor 19' (capacitor 19 in FIG. 3) is located between the two barrier layer capacitors 4' and 9'.

Figure 10:
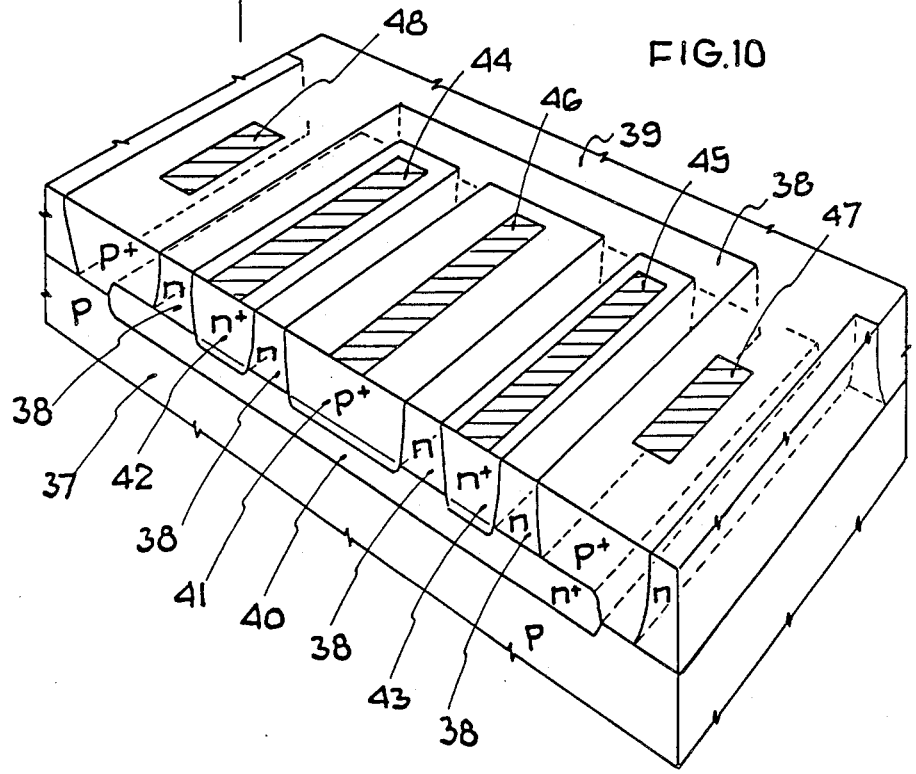
FIG. 10 shows the integration of barrier layer capacitances.

FIG. 10 shows a portion of an integrated circuit with barrier layer capacitors 4' and 19' of FIG. 9 (barrier layer capacitor 9' is not shown in FIG. 10). The semiconductor element in FIG. 10 comprises a substrate 37 and an epitaxial layer 38. Barrier layer capacitor 4' is formed substantially by zone 39 and a buried layer 40. Barrier layer capacitor 19' is formed by zone 41 and buried layer 40. Semiconductor zone 39 acts at the same time as a separation zone. Semiconductor zones 42 and 43 are connection zones for buried layer 40. Connection zone 42 is provided with a contact by means of electrode 44, and connection zone 43 by means of electrode 45. Semiconductor zone 41 is provided with a contact by means of electrode 46. Semiconductor zone 39 is provided with contacts by means of electrodes 47 and 48.

Electrodes 44 and 45 of FIG. 10 are connected to the node 49 of FIG. 9. Electrode 46 of FIG. 10 is connected to node 50 of FIG. 9. Electrodes 47 and 48 of FIG. 10 represent the substrate connection and are connected to reference point 51 of FIG. 9.

The array in FIG. 10 is manufactured by providing a semiconductor element 1 of a first conduction type with buried layer 40 of a second conduction type. The epitaxial layer 38 is then deposited. Finally, semiconductor zone 39 of the first conduction type and semiconductor zone 41 of the first conduction type are deposited, and then semiconductor zones 42 and 43 of the second conduction type are deposited.

Figure 11:
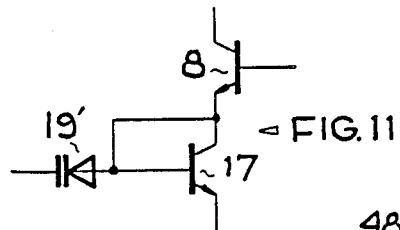
FIG. 11 shows the transistors according to FIG. 3 and the execution of capacitor 19 in FIG. 3 with a barrier layer capacitance.

FIG. 11 shows transistors 8 and 17 of FIG. 3 and the substitution of capacitor 19 of FIG. 3 with a barrier layer capacitor 19'.

Figure 12:
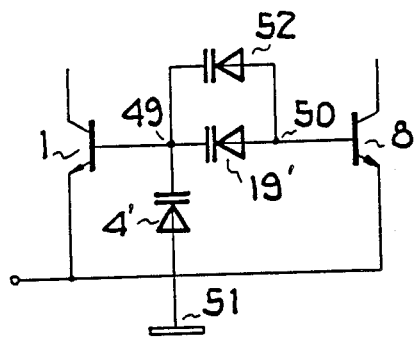
FIG. 12 shows the array in FIG. 10 with an additional barrier layer capacitance.

The array in FIG. 12 differs from that in FIG. 10 in that an additional barrier layer capacitor 52 is provided which is arranged parallel to barrier layer capacitor 19'.

Figure 13:
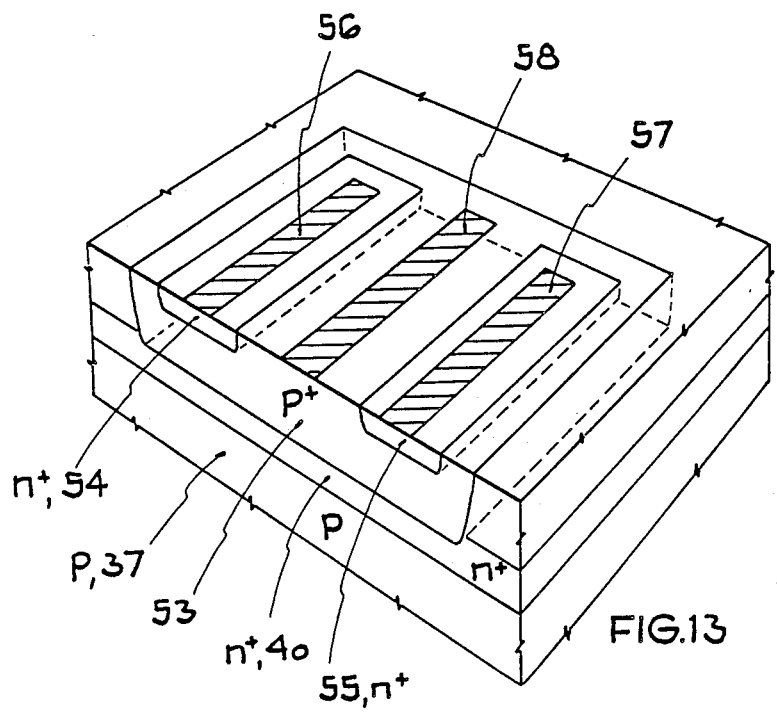
FIG. 13 shows the integration of two barrier layer capacitances.

FIG. 13 shows the integration of the two barrier layer capacitors 19' and 52. Barrier layer capacitor 19' is formed in the FIG. 12 array by semiconductor zone 53 and buried layer 40. Semiconductor zone 53 corresponds to semiconductor zone 41 in FIG. 10. Barrier layer capacitor 52 is formed by semiconductor zones 54 and 55 of the same conduction type and by semiconductor zone 53. Semiconductor zone 54 is provided with a contact by means of electrode 56, and semiconductor zone 55 by means of electrode 57. Semiconductor zone 53 is provided with a contact by means of electrode 58.

Electrodes 56 and 57 of FIG. 13 are connected to node 49 of FIG. 12. Electrode 58 of FIG. 13 is connected to node 50 of FIG. 12. The use of a parallel connection for capacitors 19' and 52 and their execution in accordance with FIG. 13 has the advantage that for a given capacitor a smaller crystal surface is possible between nodes 49 and 50 (FIGS. 9, 11 and 12).

Figure 14:
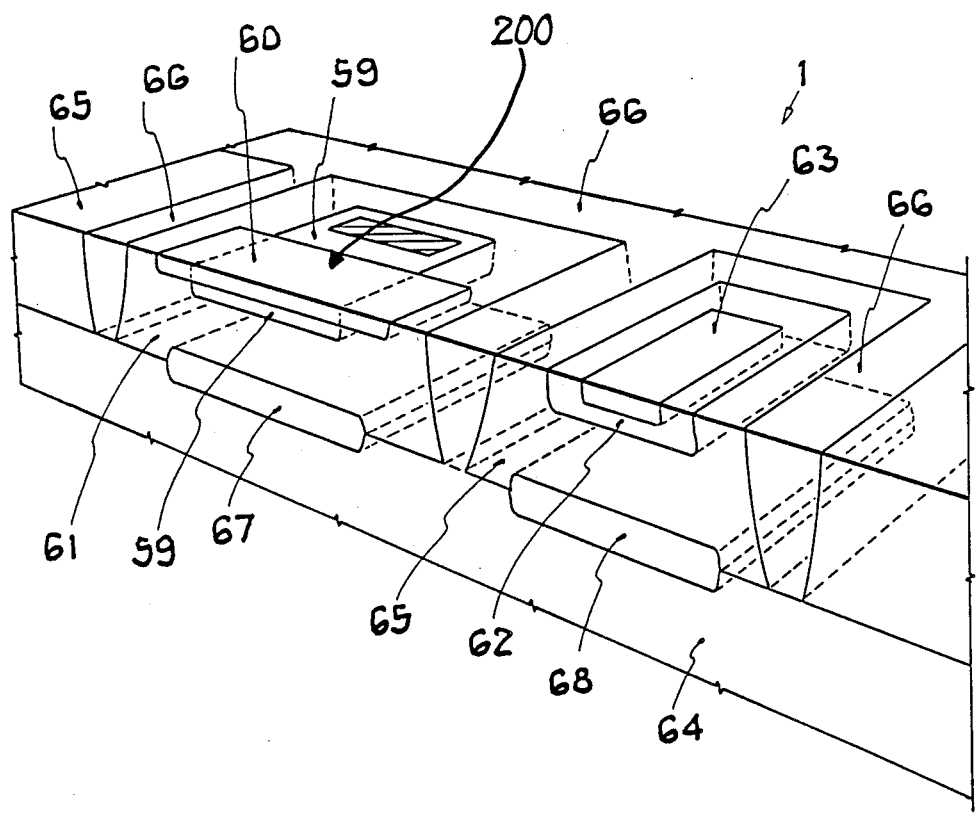
FIG. 14 shows a pinch resistor.

A pinch resistor 200 comprises, in accordance with FIG. 14, a resistance zone 59 bordered vertically by two semiconductor zones 60 and 61. The semiconductor zones 60 and 61 are of the opposite conduction type to resistance zone 59. Resistance zone 59 is manufactured in the same process step as base zone 62 of the npn transistor 1 shown in FIG. 14 next to the pinch resistor 200, so that resistance zone 59 has the same conduction, the same conductivity and the same penetration depth as the base zone 62 of transistor 1. In similar fashion, semiconductor zone 60 located above resistance zone 59 and bordering on the semiconductor surface is manufactured in the same operation as emitter zone 63 of transistor 1, so that semiconductor zone 60 has the same conduction, the same conductivity and the same depth as the emitter zone 63 of transistor 1. The semiconductor element of the integrated circuit array comprises a substrate 64 of the first conduction type, and an epitaxial layer 65 of the second conduction type. The electrical separation of the components of the circuit array in FIG. 14 is achieved with separation zones 66 of the first conduction type. Resistance zone 59 and base zone 62 are of the first conduction type. Below pinch resistor 200 and transistor 1 are buried layers 67 and 68 of the second conduction type. Instead of the separation zones 66 it is also possible to use so-called oxide insulation zones.

What is claimed is:

1. A controllable amplifier circuit, comprising:
   an amplifier transistor receiving an input signal;
   actuatable means for depriving said amplifier transistor of at least part of the input signal, said means for depriving including a further transistor connected between the emitter of said amplifier transistor and the supply voltage; said further transistor drawing part of said input signal from said amplifier transistor, for controlling amplification of said amplifier transistor and
   a plurality of controllable current sources for driving the bases of said amplifier transistor and said further transistor, with control of said amplifier transistor and said further transistor being effected by controlling their respective base currents by feeding the total output currents of the respective said current sources to the respective bases of said amplifier transistor and said further transistor.

2. An amplifier circuit according to claim 1, wherein the amplifier transistor is connected as a common base circuit.

3. A controllable amplifier circuit according to claim 1, wherein the emitters of said amplifier transistor and said further transistor are connected to an input connection which supplies the input signal to said amplifier transistor.

4. A controllable amplifier circuit according to claim 1, further comprising a capacitor connecting the base of said further transistor to a source of reference potential.

5. A controllable amplifier circuit according to claim 1, further comprising a control circuit which includes said plurality of controllable current sources for supplying the base current of said amplifier transistor and said further transistor, said control circuit being fed by a control signal.

6. A controllable amplifier circuit according to claim 5, wherein said control circuit supplying the base currents for said amplifier transistor and said further transistor comprises a differential circuit having two differential circuit transistors and two current-inverting circuit elements connected to the respective collectors of said two differential circuit transistors.

7. A controllable amplifier circuit according to claim 6, wherein the emitters of said two differential circuit transistors are connected to each another at a connection point, and further comprising a pinch resistor connected across said connection point of said emitters of said two differential circuit transistors and a source of reference potential.

8. A controllable amplifier circuit according to claim 6, wherein said emitter of said two differentiasl circuit transistors are connected at a connection point and further comprising an additional transistor whose collector in connected to the collector of one of said two differential circuit transistors and whose emitter is connected to said connection point of the emitters of said two differential circuit transistors.

9. A controllable amplifier circuit according to claim 8, wherein said connection point of the emitters of said two differential circuits transistors is connected to a source of reference potential via a pinch resistor.

10. A controllable amplifier circuit according to claim 6, further comprising an additional transistor whose collector is connected to the collector of one of said two differential circuit transistors, a source of reference potential, and a pinch resistor, and wherein the emitter of said additional transistor is connected to said source of reference potential via said pinch resistor.

11. A controllable amplifier circuit according to claim 5, wherein said control circuit for said amplifier comprises a differential circuit and a current inverting circuit, wherein said curren-inverting circuit drives said differential circuit, and wherein said current-inverting circuit comprises two additional transistor of which one is a multicollector transistor.

12. A controllable amplifier circuit according to claim 11, wherein the emitters of said two differential circuit transistors are connected to each other at a connection point, and wherein one collector of said multicollector transistor of said current-inverting circuit supplies said connection point of said two differential circuit transistors.

13. A controllable amplifier circuit according to claim 11, further comprising a source of reference potential and a pinch resistor connected at one end to said source of reference potential, and wherein the emitter of the other one of said two additional transistors is connected to said source of reference potential and to one collector of said multi-collector transistor and to the other end of said pinch resistor, whereby the emitter of said other one of said two additinal transistors is connected via said pinch resistor to said source of reference potential.

14. A controllable amplifier circuit according to claim 11, further comprising a source of operating potential connected to the emitter of said multi-collector transistor of said current inverter.

15. An integrated amplifier circuit according to claim 14, wherein said differential circuit includes two differential circuit transistors, wherein the emitters of said two differential circuit transistors are connected to each other at a connection point, and wherein one collector of said multi-collector transistor feeds said connection point of the emitter of said two differential circuit transistors.

16. A controllable amplifier circuit according to claim 11, further comprising a voltage source connected to the base of the other one of said two transistors which drives said multi-collector transistor.

17. A controllable amplifier circuit accordidng to claim 16, further comprising a pinch resistor and a source of reference potential connected to one end of said pinch resistor, and wherein said voltage source supplying the base potential for said other one of said transistors is relatively independent of temperature in an operating temperature range.

18. A controllable amplifier circuit according to claim 5, wherein said control circuit for said amplifier comprises a current inverting circuit and a differential circuit having two differential transistors, and wherein one of said two differential circuit transistors, is a multicollector transistor and one collector of said multi-collector transistor supplies an output from said differential circuit, while another collector of said multi-collector transistor is connected to the collector of the other one of said two differential circuit transistors.

19. A controllable amplifier circuit according to claim 1, wherein said controllable current sources are fed by a control signal.

20. A controllable amplifier circuit according to claim 1, wherein the base currents of said amplifier transistor and said further transistor are controlled in opposite directions.

21. A controllable amplifier circuit according to claim 1, wherein the sum of the base currents of said amplifier transistor and said further transistor remains constant during operation of said actuatable means.

22. A controllable amplifier circuit according to claim 1, further comprising a voltage source supplying the collector of said further transistor.

23. A controllable amplifier circuit according to claim 1, further comprising a selection circuit connected at a collector output of said amplifier transistor.

24. A controllable amplifier circuit according to claim 1, further comprising a first capacitor connected between the base of said amplifier transistor and a source of reference potential, and a second capacitor connected at one end to a joint base-collector connection of said further transistor and at its other end to said first capacitor.

25. A controllable amplifier circuit according to claim 1, wherein said circuit is an element of an integrated semiconductor device and comprises:
 a substrate of a first conduction type,
 an epitaxial of a second conduction type, and
 a buried layer of the second conduction type disposed in said substrate, wherein a semiconductor zone of the first conduction type in said epitaxial layer and forms together with said buried layer a barrier layer capacitor which acts as a blocking capacitor of a transistor, and wherein a second semiconductor zone of the first conduction type is disposed in said epitaxial layer and forms together with said buried layer a barrier layer capacitor which acts as a capacitor connected between said blocking capacitor and a following transistor switched as a diode.

26. A controllable amplifier circuit according to claim 25, wherein in the second semiconductor zone of the first conduction type, two semiconductor zones of the second conduction type are disposed which form, together with said second semiconductor zone of the first conduction type, barrier layer capacitors connected parallel to that barrier layer capacitor formed by said second semiconductor zone and said buried layer.

27. A controllable amplifier circuit, comprising:
 an amplifier transistor receiving an input signal,
 actuatable means for depriving said amplifier transistor of at least part of the input signal, said means for depriving including a further transistor connected across the emitter-collector path of said amplifier transistor;
 a plurality of controllable current for driving the bases of said amplifier transistor and said further transistor; and
 a third transistor switched as a diode, said third transistor being connected by its emitter-collector path between said input connection and the emitter of said further transistor.

28. A controllable amplifier circuit according to claim 27, further comprising a capacitor connected at one end to the base and the collector of said third transistor and connected at its other end to a source of reference potential.

* * * * *